United States Patent
Lai et al.

(10) Patent No.: US 7,501,683 B2
(45) Date of Patent: Mar. 10, 2009

(54) INTEGRATED CIRCUIT WITH PROTECTED IMPLANTATION PROFILES AND METHOD FOR THE FORMATION THEREOF

(75) Inventors: Tommy Lai, Kowloon (HK); Pradeep Ramachandramurthy Yelehanka, Singapore (SG); Jia Zhen Zheng, Singapore (SG); Weining Li, Shanghai (CN)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 11/421,047

(22) Filed: May 30, 2006

(65) Prior Publication Data

US 2006/0220110 A1    Oct. 5, 2006

Related U.S. Application Data

(62) Division of application No. 10/689,923, filed on Oct. 17, 2003, now Pat. No. 7,067,362.

(51) Int. Cl.
  *H01L 29/792* (2006.01)
(52) U.S. Cl. .................... 257/324; 257/410
(58) Field of Classification Search ............... 257/330, 257/324, 266, 410, 411
  See application file for complete search history.

(56) References Cited

U.S. PATENT DOCUMENTS

| | | | | |
|---|---|---|---|---|
| 5,985,718 A * | 11/1999 | Dalla Libera et al. | ....... | 438/264 |
| 6,211,548 B1 * | 4/2001 | Ma | ............... | 257/321 |
| 6,297,111 B1 * | 10/2001 | Krivokapic | ............... | 438/302 |
| 6,403,420 B1 * | 6/2002 | Yang et al. | ............... | 438/261 |
| 6,436,768 B1 * | 8/2002 | Yang et al. | ............... | 438/266 |
| 6,440,797 B1 * | 8/2002 | Wu et al. | ............... | 438/261 |
| 6,531,366 B1 * | 3/2003 | Kouznetsov | ............... | 438/303 |
| 6,586,296 B1 * | 7/2003 | Watt | ............... | 438/224 |
| 6,713,334 B2 * | 3/2004 | Nandakumar et al. | ....... | 438/199 |
| 6,797,565 B1 * | 9/2004 | Yang et al. | ............... | 438/261 |
| 2003/0232472 A1 * | 12/2003 | Wu | ............... | 438/257 |
| 2004/0183126 A1 * | 9/2004 | Bae et al. | ............... | 257/324 |

* cited by examiner

*Primary Examiner*—Kevin M Picardat
(74) *Attorney, Agent, or Firm*—Mikio Ishimaru

(57) ABSTRACT

An integrated circuit structure includes providing a semiconductor substrate and forming at least one oxide-nitride-oxide dielectric layer above the semiconductor substrate. At least one implantation is formed into at least one area of the semiconductor substrate beneath the oxide-nitride-oxide dielectric layer subsequent to the formation of the oxide-nitride-oxide dielectric layer.

10 Claims, 4 Drawing Sheets

INTEGRATED CIRCUIT WITH PROTECTED IMPLANTATION PROFILES AND METHOD FOR THE FORMATION THEREOF

CROSS-REFERENCE TO RELATED APPLICATION(S)

This is a divisional of co-pending application Ser. No. 10/689,923 filed Oct. 17, 2003, which is hereby incorporated by reference thereto.

TECHNICAL FIELD

The present invention relates generally to semiconductor integrated circuit devices and methods for the production thereof, and more particularly to methods and devices for protecting from thermal degradation.

BACKGROUND ART

As semiconductor devices become denser and circuit features smaller, prior fabrication processes often become less effective. For example, certain materials (dopants, ions, etc.) are implanted and/or diffused in particular patterns into semiconductor substrates. Increased miniaturization of semiconductor devices means that these implantation patterns have become more vulnerable to subsequent heat treatments in the manufacturing process. Such heat treatments, which often follow those implantations, may cause excessive further diffusion of the implantation materials. This will unfavorably affect their distribution, harming desired physical features such as retrograde wells or very sharp channel implantation profiles. This can lead to various problems such as fluctuations in threshold voltage, increases in junction capacitance, deterioration of carrier mobility on the surface of a substrate, and so forth, causing degraded operational performance.

Various technologies are known for controlling implantations and subsequent heat diffusions, but they typically involve multiple mask, implantation, and heat steps. These must be coordinated so that subsequent heat steps do not harm earlier implantation profiles by causing undue additional movement of prior implantation materials. For example, when such a subsequent heat treatment is conducted rapidly (e.g., on the order of minutes), the portions of the semiconductor wafer nearer the top and bottom surfaces are heated more than those in between, making it difficult to maintain implantation profiles that were created earlier. Such problems are increasingly difficult to manage as circuit features on the semiconductor become increasingly smaller.

For example, product development efforts in electrically erasable programmable read only memory ("EEPROM") device technology have focused on increasing the programming speed, lowering programming and reading voltages, increasing data retention time, reducing cell erasure times, and reducing cell dimensions. In this regard, one important dielectric material for the fabrication of the EEPROM devices is the so-called "ONO" structure. That is, the production of nonvolatile memory ("NVM") devices typically involves formation of an oxide-nitride-oxide ("ONO") layer on the silicon substrate. Such an ONO layer structure is three dielectric materials layered on one another, usually silicon oxide ("$SiO_2$"), silicon nitride ("SiN"), and $SiO_2$, respectively. During programming, electrical charge is transferred to the SiN layer in the ONO structure, where it is retained even after the device has been turned off. A flash memory cell that utilizes the ONO structure is often referred to as a Silicon-Oxide-Nitride-Oxide-Silicon ("SONOS") type cell.

An advantage of SONOS flash memory transistors is that they may have a lower programming voltage than some other nonvolatile memory devices. As an example, a SONOS transistor may be programmed and/or erased with a voltage of about half the voltage of other nonvolatile memory technology. Such a lower programming voltage can result in a nonvolatile storage circuit that may be more easily utilized with existing manufacturing processes and circuit technologies.

Although there are many advantages with SONOS type memory devices, there are disadvantages as well. In some instances, it is difficult to form the charge trapping layer over a silicon substrate or gate oxide layer with precision, uniformity, high quality (no defects), and without contamination. Another disadvantage is the high-temperature process that is needed to make the ONO structures. This high heat can cause undesirable distortion of prior structures already formed on the semiconductor substrate die, such as channel and well implantation profiles. In this regard, it should be noted that channel and well implantations into the underlying substrate are ordinarily done before formation of other layers on top of the substrate, such as the ONO layer. However, as indicated, the ONO formation is a high-temperature process that unfortunately can considerably change the profiles of such prior channel and well implantations.

Such well implantation profiles provide important operational benefits. One example relates to exposure to radiation, which can cause a memory cell to lose its data. For example, in a memory-type integrated circuit, a so-called "soft error" may arise in which information that is stored in the integrated circuit is accidentally lost. A typical cause of such a soft error is radiation (e.g., cosmic rays; x-rays; alpha, beta, and/or gamma radiation) passing through the circuit. One means for solving this problem is to use an implantation profile such as a retrograde well. A retrograde well consists of a doped region with a dopant concentration that varies with depth (i.e., a concentration level that is "vertically graded"). Preferably, the implanted dopant concentration is lowest at or near the substrate upper surface and highest at the bottom of the well into which it is implanted. This increase in the dopant or impurity concentration at the bottom of a well is usually achieved by implanting the impurity in the semiconductor substrate by means of high-energy ion implantation. Almost all retrograde well structures are formed by this means.

Whether the implantation is conducted to form a retrograde well or to form a conventional well, it is important that the shape or profile of the implanted well be preserved during subsequent manufacturing operations as the integrated circuit is being completed. Conventional wells are formed by implanting dopants at the well locations and then diffusing them (usually through a high temperature diffusion process) to the desired depth. For this reason, such wells are also referred to as diffusion wells. One drawback associated with diffusion wells is that the diffusion occurs laterally as well as vertically, e.g. the diffusion well gets wider as it gets deeper. A second drawback associated with diffusion wells is that relatively large spaces between the edges of the wells and the device active areas are required.

A retrograde well profile attempts to overcome the lateral spreading problem by implanting high-energy dopants to the desired depth so that high temperature diffusion is not necessary. Retrograde wells require less space between the edges of the well and device active areas than the space required by diffusion wells. Retrograde wells are therefore desirable for high-density applications.

In certain applications, it makes sense to use both well types (conventional and retrograde) on a single integrated circuit. For example, in flash memory applications, which contain a low voltage peripheral circuit portion and a high voltage circuit portion, it is desirable to have the low voltage peripheral circuit portion formed in retrograde wells and the high voltage circuit portion formed in conventional diffusion wells.

In all such cases, unfortunately, subsequent high-temperature operations (such as ONO formation) can lead to distortion of these well configurations and profiles. This is especially true when high-temperature treatments are conducted, since this can cause further diffusion (spreading) of the dopants beyond the boundaries where they are supposed to remain.

Thus, a need remains for semiconductor fabrication methods that will preserve implantation profiles and protect them from thermal degradation during ONO layer formation. Solutions to these problems have been long sought but prior developments have not taught or suggested any solutions and, thus, solutions to these problems have long eluded those skilled in the art.

DISCLOSURE OF THE INVENTION

The present invention provides an integrated circuit structure. A semiconductor substrate is provided, and at least one oxide-nitride-oxide dielectric layer is formed above the semiconductor substrate. At least one implantation is formed into at least one area of the semiconductor substrate beneath the oxide-nitride-oxide dielectric layer subsequent to the formation of the oxide-nitride-oxide dielectric layer. This method of semiconductor fabrication preserves implantation profiles and protects them from thermal degradation during oxide-nitride-oxide dielectric layer formation.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

The term "horizontal" as used herein is defined as a plane parallel to the conventional plane or surface of the silicon wafer, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

In the fabrication of integrated circuits, it is important to protect and preserve the profiles of the various discrete structures that are formed thereon. As circuits and circuit features become ever smaller and smaller, this need becomes increasingly critical. For example, it is often necessary or desirable to fabricate both n-type and p-type devices on a single substrate. In order to fabricate both types of devices in a single substrate, typically a large area of a substrate of one type is doped to the other type in a large well. An example would be an n-well (a well formed of n-type material) in an integrated circuit being fabricated on a p-type substrate. Inside the n-well, for example could be a p-type source and drain on either side of a gate stack. The gate stack could be formed of a gate dielectric, a gate electrode, and an insulating cap. Together, the gate stack and the source and drain then form a p-type field-effect transistor. Field oxide regions would isolate the transistor from other devices on the substrate. Preservation of these implantation profiles is therefore clearly necessary.

Many integrated circuits rely on an oxide-nitride-oxide ("ONO") layer formation. ONO formation is a high-temperature process that can change prior implantation impurity profiles significantly. The present invention teaches a method for protecting such implantation profiles from thermal degradation during ONO layer formation.

Figure 1:
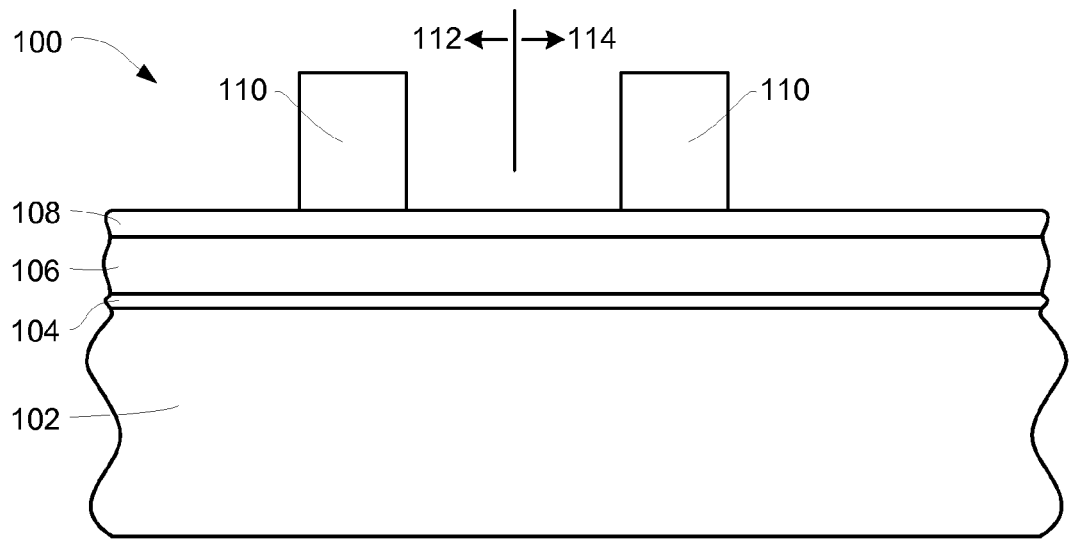
FIG. 1 is a cross-sectional view of a portion of a silicon wafer in the first stages of processing to fabricate an integrated circuit device.

Referring now to FIG. 1, therein is shown a cross-section of a silicon wafer 100 in the first stages of processing to fabricate an integrated circuit device in which various implantations, such as well, threshold, and channel implantations, are protected from unnecessary thermal degradation.

The silicon wafer 100 has a semiconductor substrate 102, such as silicon ("Si"), on which an ONO dielectric layer 104 has been formed. The ONO dielectric layer 104 is an oxide-nitride-oxide stack comprising a bottom silicon dioxide ($SiO_2$) layer, a silicon nitride (SiN) layer, and a top silicon dioxide layer. Formation of such an ONO dielectric layer involves a high-temperature process, and by thus forming the ONO layer first before subsequent fabrication steps, those subsequent fabrication steps are spared from exposure to the high-temperature ONO process.

As further illustrated in FIG. 1, a layer of polysilicon 106 has been formed on the ONO dielectric layer 104, and a nitride hardmask 108 (e.g., SiN, $SiO_2/Si_3N_4$, or OxyNitride (Si—O—N)) has been formed on the layer of polysilicon 106. A composite mask 110 is then patterned and formed on the nitride hardmask 108 to provide for subsequent etching in various areas of the silicon wafer 100, for example, in an array area 112 and a periphery area 114.

Figure 2:
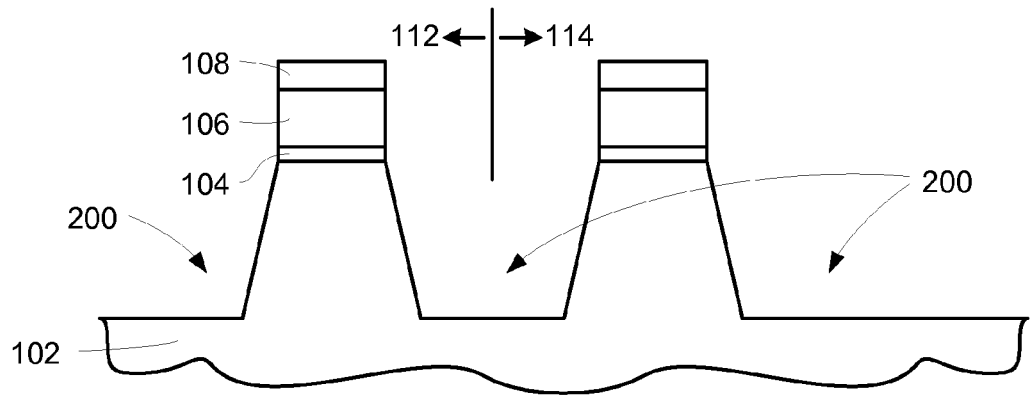
FIG. 2 is the structure of FIG. 1 following etching of the layers and formation of trenches on the semiconductor substrate.

Referring now to FIG. 2, therein is shown the structure of FIG. 1 following etching of the nitride hardmask 108, the layer of polysilicon 106, the ONO dielectric layer 104, and the semiconductor substrate 102. The etching has formed shallow trench isolation ("STI") trenches 200.

Figure 3:
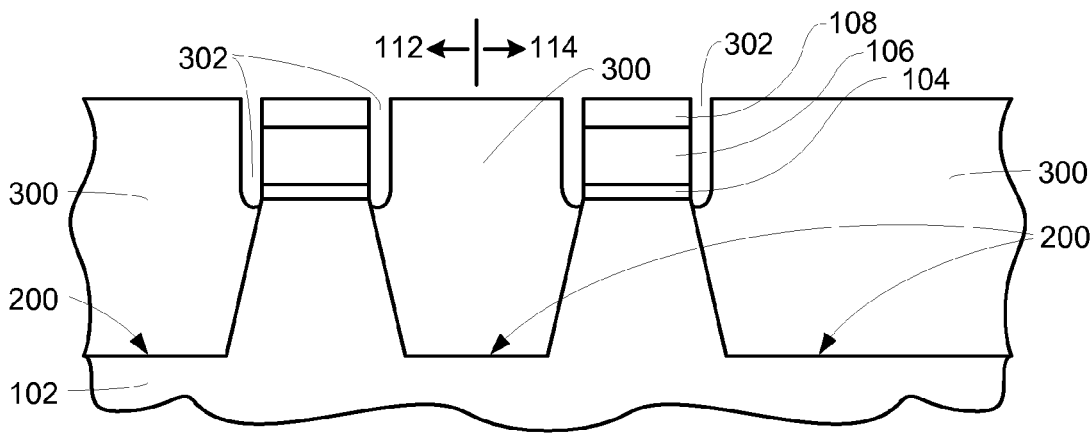
FIG. 3 is the structure of FIG. 2 after filling the trenches with a trench fill.

Referring now to FIG. 3, therein is shown the structure of FIG. 2 after the STI trenches 200 have been filled with a trench fill 300, such as an oxide deposit (e.g., high-density plasma or $O_3$-tetraethylorthosilicate ("TEOS"), thermal TEOS). The trench fill 300 has been polished, such as by chemical-mechanical planarization ("CMP"), to get a flat surface. Then, the usual dilute hydrofluoric acid ("DHF") dip has been used to form divots or small gaps 302 resulting from accumulation of DHF at the edge of the hydrophobic silicon.

Figure 4:
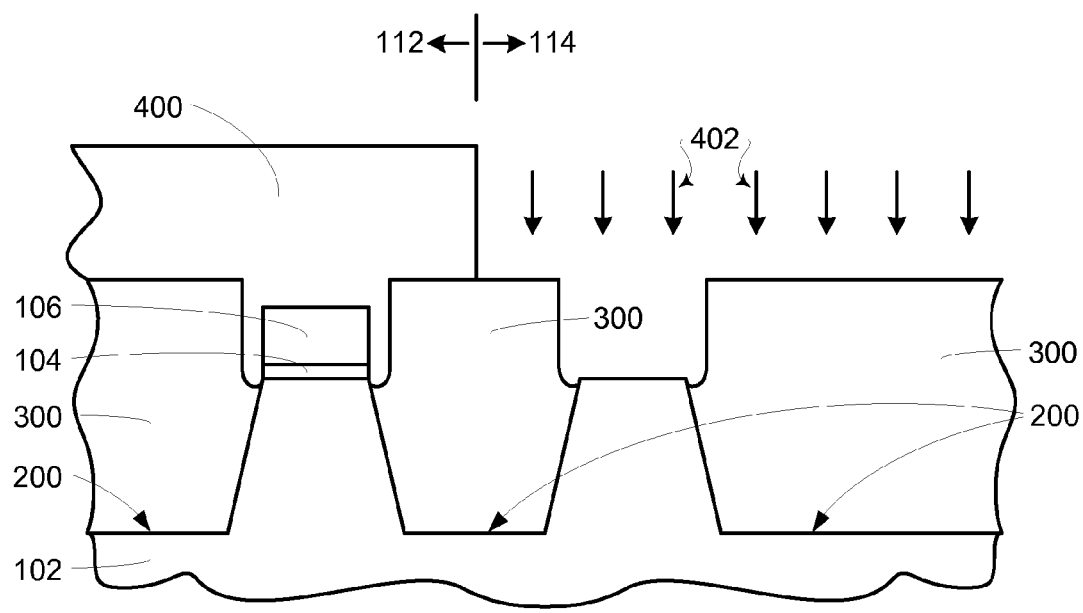
FIG. 4 is the structure of FIG. 3 following removal of the nitride hardmask, formation of an array area photoresist mask, and well and threshold implantation in the periphery area.

Referring now to FIG. 4, therein is shown the structure of FIG. 3 following removal of the nitride hardmask 108. In addition, an array area photoresist mask 400 has been patterned and formed over the array area 112, and the polysilicon 106 in the periphery area 114, not protected by the array area photoresist mask 400, has been removed by etching. Similarly, the ONO dielectric layer 104 in the periphery area 114 has been removed by a wet etch. The arrows 402 indicate well and threshold implantation that are then performed in the periphery area 114, which is not protected by the array area photoresist mask 400. The implantations, for example, would be typical CMOS process flow steps for n-well, p-well, and threshold adjustment implantations and corresponding thermal cycles.

Figure 5:
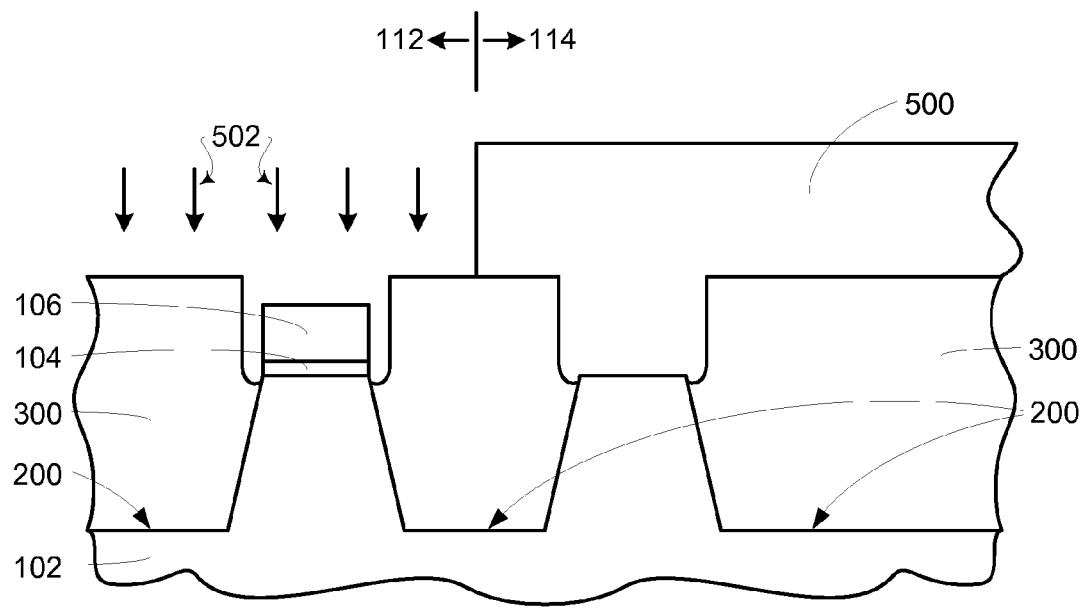
FIG. 5 is the structure of FIG. 4 following removal of the array area photoresist mask, formation of a periphery area photoresist mask, and well and threshold implantation in the array area.

Referring now to FIG. 5, therein is shown the structure of FIG. 4 following removal of the array area photoresist mask 400 and formation of a periphery area photoresist mask 500 over the various implanted layers in the periphery area 114. The arrows 502 illustrate well and threshold implantation in the array area 112 similar to the well and threshold implantation for the periphery area 114 illustrated by the arrows 402 (FIG. 4). The well and threshold implantation illustrated by the arrows 502 thus forms implantation regions beneath the ONO dielectric layer 104 having diffusion that is unaffected by the ONO dielectric layer 104.

Figure 6:
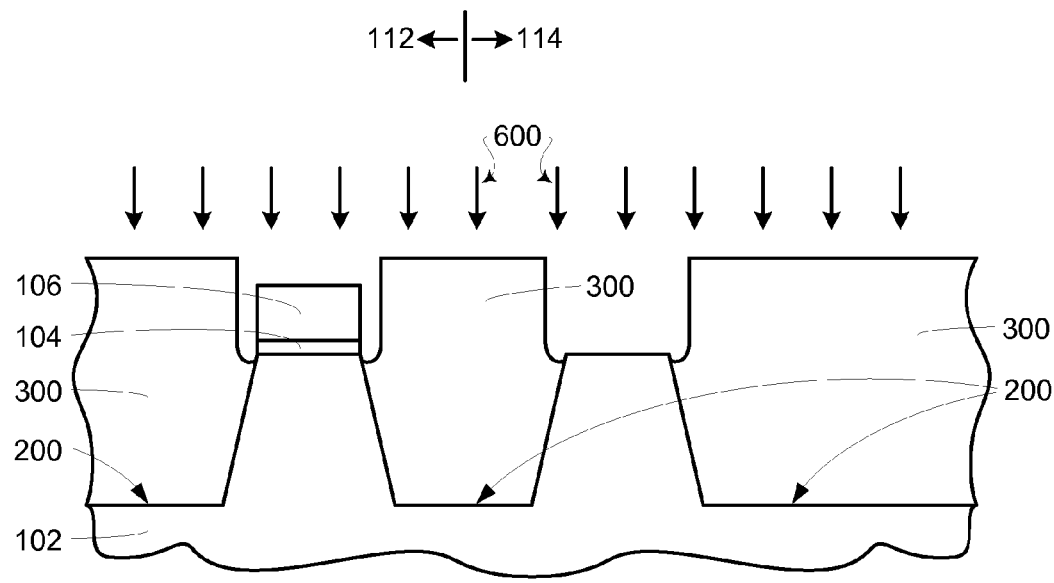
FIG. 6 is the structure of FIG. 5 following removal of the periphery area photoresist mask, and showing channel implantation in the array and periphery areas.

Referring now to FIG. 6, therein is shown the structure of FIG. 5 following removal of the periphery area photoresist mask 500. The arrows 600 illustrate channel implantation that is performed in conventional fashion in the array area 112 and the periphery area 114, as appropriate.

Figure 7:
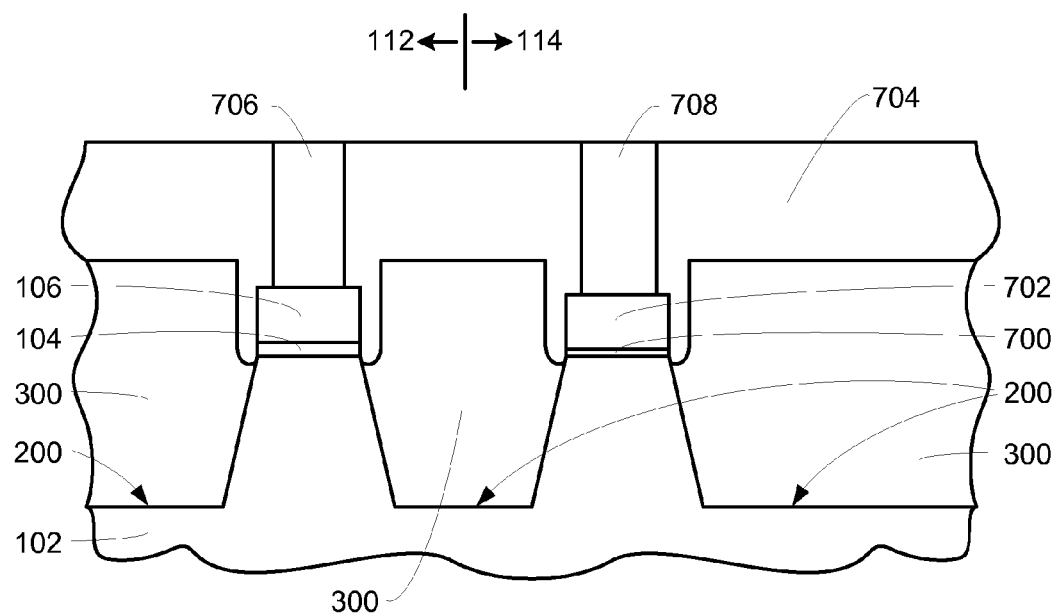
FIG. 7 is the structure of FIG. 6 after formation of gate dielectric and control gate layers, an interlayer dielectric layer, and electrical contacts therethrough.

Referring now to FIG. 7, therein is shown the structure of FIG. 6 after formation, for example, of a gate dielectric layer 700 and a control gate layer 702, as appropriate, such as in the periphery area 114 as illustrated. An interlayer dielectric ("ILD") layer 704 (e.g., a poly gap fill) has then been formed over the various layers on the semiconductor substrate 102. Electrical contacts 706 in the array area 112 and electrical contacts 708 in the periphery area 114 are also shown, formed in conventional manner through the ILD layer 704 to connect to the various devices therebeneath, such as to the polysilicon 106 and to the control gate layer 702.

In a typical process (not shown) for forming these electrical contacts, suitable etch stop, dielectric, and photoresist layers are formed in conventional fashion over the semiconductor substrate 102 and the various layers thereon. The photoresist is photolithographically processed to form a pattern of contact openings. An anisotropic etch is used to form contact openings in the ILD layer 704. The contact openings for the electrical contacts 706 and 708 stop at the polysilicon 106 and the control gate layer 702, respectively. The photoresist is then stripped and a conductive material, such as tungsten, is deposited over the ILD layer 704 and fills the contact openings to form so-called "self-aligned" conductive contacts. The substrate is then subjected to a CMP process, which removes the conductive material above the ILD layer 704, completing formation of the contacts, such as the electrical contacts 706 and 708 as illustrated.

Figure 8:
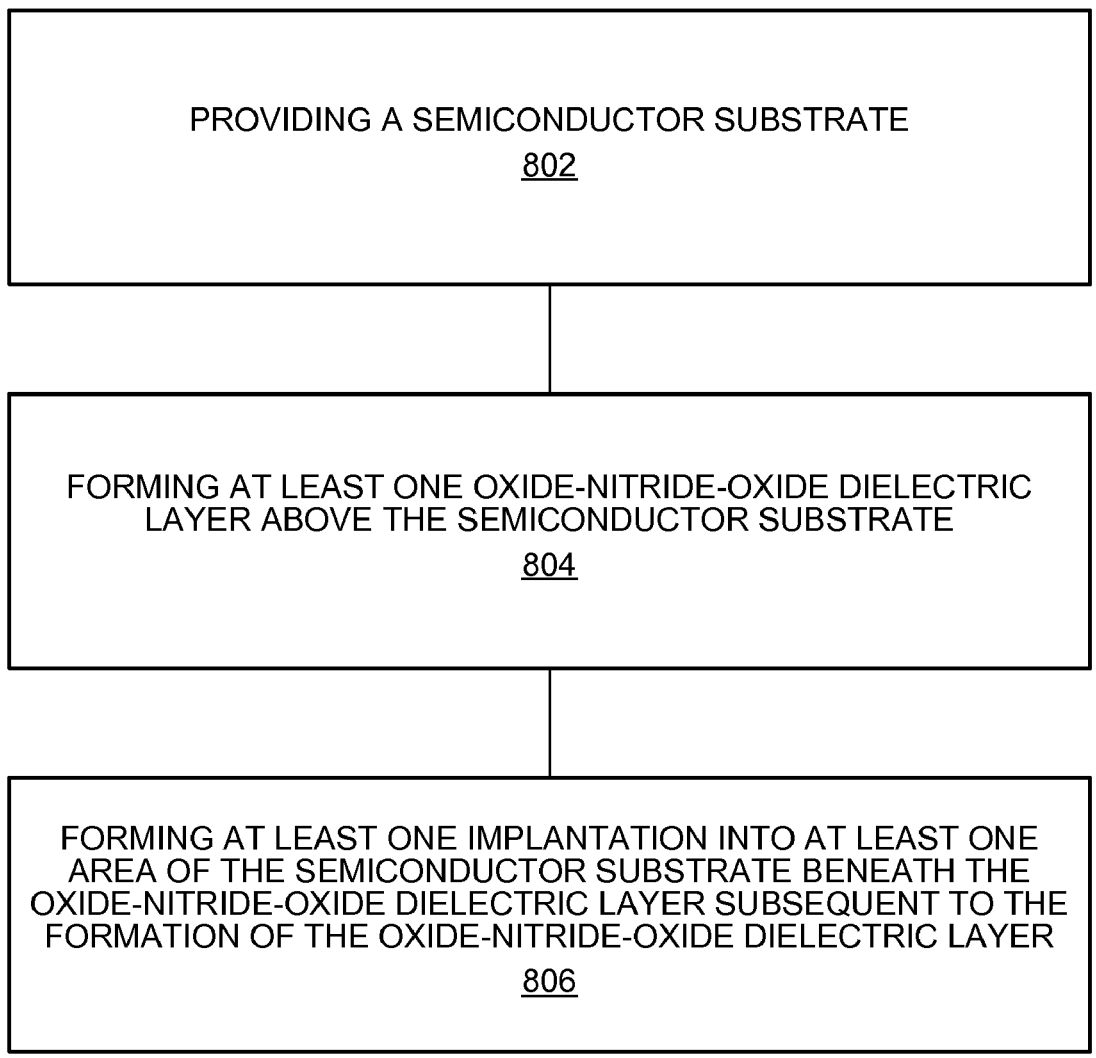
FIG. 8 is a flowchart of a method for manufacturing an integrated circuit structure in accordance with the present invention, in which implantation profiles are protected from thermal degradation during oxide-nitride-oxide layer formation.

Referring now to FIG. 8, therein is shown a flow chart of a method for protecting implantation profiles from thermal degradation during ONO layer formation. The method 800 for manufacturing an integrated circuit structure in accordance with the present invention includes a step 802 of providing a semiconductor substrate; a step 804 of forming at least one oxide-nitride-oxide dielectric layer above the semiconductor substrate; and a step 806 of forming at least one implantation into at least one area of the semiconductor substrate beneath the oxide-nitride-oxide dielectric layer subsequent to the formation thereof.

In greater detail, a manufacturing method to protect implantation profiles from thermal degradation during ONO dielectric layer formation is performed as follows:

1. The semiconductor substrate 102 is suitably prepared and the ONO dielectric layer 104 is formed thereon. The layer of polysilicon 106 and the nitride hardmask 108 are formed over the ONO dielectric layer 104, and the composite mask 110 is patterned and formed in the array area 112 and the periphery area 114 over the nitride hardmask 108. (FIG. 1)

2. The nitride hardmask 108, the layer of polysilicon 106, the ONO dielectric layer 104, and the semiconductor substrate 102 are etched in the areas not protected by the composite mask 110 to form the STI trenches 200. The composite mask 110 is then removed. (FIG. 2)

3. The STI trenches 200 are filled with the trench fill 300 and the trench fill 300 receives a CMP polish to get a flat surface. (FIG. 3)

4. The nitride hardmask 108 is removed and the array area photoresist mask 400 is formed over the several layers in the array area 112. The polysilicon in the periphery area 114 is removed by etching, and the ONO dielectric in the periphery area 114 is removed by a wet etch. The periphery area 114 then receives well and threshold implantation, as illustrated by the arrows 402. (FIG. 4)

5. The array area photoresist mask 400 is then removed and the periphery area photoresist mask 500 is formed over the various layers in the periphery area 114.

The array area 112 then receives well and threshold implantation, as illustrated by the arrows 502. (FIG. 5)

6. The periphery area photoresist mask 500 is then removed and channel implantations, illustrated by the arrows 600, are formed as appropriate in the various regions over the semiconductor substrate 102. (FIG. 6)

7. The gate dielectric layer 700 and the control gate layer 702 are formed, as appropriate. The ILD layer 704 is formed over the various layers on the semiconductor substrate 102, and the electrical contacts, including the electrical contacts 706 and 708, are formed through the ILD layer 704 to the various active circuit elements, in conventional manner, such as to the polysilicon 106 and to the elements in the control gate layer 702. The final structure is then completed with conventional finishing steps (not shown). (FIG. 7)

It has been discovered that the present invention has numerous advantages. Principal among these is the ONO formation prior to the several implantations. As a result, the implantations are not exposed to the high-temperature ONO process and thus form implantation regions beneath the ONO dielectric layer having diffusion that is unaffected by the ONO dielectric layer. Thus, the profiles of the implantations are not altered or damaged by the high-temperature ONO process. The invention thus provides for both well-formed retrograde wells and sharp channel profiles. In addition, it can reduce the narrow width effect by retaining more channel impurity in the channel region.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. An integrated circuit structure, comprising:
   a semiconductor substrate;
   at least one oxide-nitride-oxide dielectric layer above the semiconductor substrate, all of the oxide-nitride-oxide dielectric layer being characterized by an implantation therethrough into the semiconductor substrate;
   at least one implantation region in at least one area of the semiconductor substrate beneath the oxide-nitride-oxide dielectric layer having diffusion unaffected by formation of the oxide-nitride-oxide dielectric layer; and
   an interlayer dielectric layer over at least portions of the implantation region and the oxide-nitride-oxide dielectric layer.

2. The integrated circuit structure of claim 1 wherein the implantation is a channel implantation.

3. The integrated circuit structure of claim 1 wherein the implantation is a well and threshold implantation.

4. The integrated circuit structure of claim 3 wherein the well and threshold implantation is into one of an array area and a periphery area over the semiconductor substrate, and further comprising another well and threshold implantation into the other of the array and periphery areas over the semiconductor substrate.

5. The integrated circuit structure of claim 4 further comprising a channel implantation formed into the array area and the periphery area.

6. An integrated circuit structure, comprising:
   a semiconductor substrate having an array area and a periphery area;
   an oxide-nitride-oxide dielectric layer formed on the array area on the semiconductor substrate, all of the oxide-nitride-oxide dielectric layer being characterized by an implantation therethrough into the semiconductor substrate;
   a layer of polysilicon formed on the oxide-nitride-oxide dielectric layer;
   the layer of polysilicon, oxide-nitride-oxide dielectric layer, and semiconductor substrate being etched to form shallow trench isolation trenches;
   a polished oxide gap fill filling the shallow trench isolation trenches; and
   a well and threshold implantation region in the semiconductor substrate beneath the oxide-nitride-oxide dielectric layer over the array area, the well and threshold implantation having diffusion unaffected by formation of the oxide-nitride-oxide dielectric layer.

7. The integrated circuit structure of claim 6 further comprising a well and threshold implantation into the semiconductor substrate in the periphery area.

8. The integrated circuit structure of claim 7 further comprising a channel implantation over the array area and the periphery area into the semiconductor substrate therebeneath.

9. The integrated circuit structure of claim 8 further comprising:
   a gate dielectric layer over at least portions of the periphery area;
   at least one control gate layer over at least portions of the gate dielectric layer; and
   an interlayer dielectric layer over at least portions of the array area and the periphery area.

10. The integrated circuit structure of claim 9 further comprising at least one electrical contact through the interlayer dielectric layer to at least one portion of the control gate layer therebeneath, and at least one electrical contact through the interlayer dielectric layer to at least one portion of the polysilicon therebeneath.

* * * * *